(12) United States Patent
Seo et al.

(10) Patent No.: US 8,748,312 B2
(45) Date of Patent: Jun. 10, 2014

(54) METHOD OF MANUFACTURING SUBSTRATE FOR MOUNTING ELECTRONIC DEVICE

(71) Applicant: Samsung Electronics Co., Ltd., Gyeonggi-do (KR)

(72) Inventors: Jong Wan Seo, Gyeonggi-do (KR); Hyung Kun Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/722,456

(22) Filed: Dec. 20, 2012

(65) Prior Publication Data
US 2013/0157417 A1   Jun. 20, 2013

(30) Foreign Application Priority Data
Dec. 20, 2011 (KR) .................. 10-2011-0138348

(51) Int. Cl.
*H01L 21/44* (2006.01)
(52) U.S. Cl.
USPC ........... 438/667; 438/107; 438/613; 438/666; 257/E21.597
(58) Field of Classification Search
CPC ............ H01L 2224/97; H01L 2224/482; H01L 2927/00
USPC .......... 438/107, 118–119, 127, 612–615, 438/666–667; 257/E21.122, E21.597
See application file for complete search history.

(56) References Cited

U.S. PATENT DOCUMENTS

2006/0073701 A1* 4/2006 Koizumi et al. .............. 438/666
2010/0212950 A1* 8/2010 Sakaguchi et al. ............ 174/262

FOREIGN PATENT DOCUMENTS

JP   2006-108236 A   4/2006
JP   2008-300782 A   12/2008

OTHER PUBLICATIONS

Kumagai, K. et al. "A Silicon Interposer BGA Package with Cu-Filled TSV and Multi-Layer Cu-Plating Interconnect". Electronic Components and Technology Conference. 2008. pp. 571-576.

* cited by examiner

*Primary Examiner* — Thanhha Pham
(74) *Attorney, Agent, or Firm* — McDermott Will & Emery LLP

(57) ABSTRACT

A method of manufacturing a substrate for mounting an electronic device, includes forming at least one through-hole in a plate-shaped substrate body in a thickness direction thereof. An electrode substrate having at least one core on an upper surface thereof is formed such that the at least one core corresponds to the at least one through-hole. The electrode substrate is coupled to the substrate body by inserting the at least one core into the at least one through-hole. A portion of the coupled electrode substrate is removed except for the at least one core.

17 Claims, 4 Drawing Sheets

METHOD OF MANUFACTURING SUBSTRATE FOR MOUNTING ELECTRONIC DEVICE

CROSS-REFERENCE TO RELATED APPLICATION

This application claims benefit of priority to Korean Patent Application No. 10-2011-0138348 filed on Dec. 20, 2011, in the Korean Intellectual Property Office, the entire contents of which are hereby incorporated by reference.

TECHNICAL FIELD

The present inventive concept relates to a method of manufacturing a substrate for mounting an electronic device.

BACKGROUND

A light emitting diode (LED) is a device able to emit light when electrical energy is applied thereto. An LED converts energy generated due to electron-hole recombination occurring at a p-n junction between p-type and n-type semiconductors into light to be emitted thereby. Such an LED is widely used as a light source in an illuminating apparatus, a display device or the like, and the development thereof is therefore being accelerated.

In particular, with the increasingly widespread use and commercialization of cell phone keypads, side viewers, camera flashes and the like using a GaN-based LED whose development and use are currently being accelerated, the development of a general illuminating apparatus using an LED is also being undertaken. LEDs are being applied to large-sized, high output and high efficiency products such as backlight units for large TVs, vehicle headlights, general illuminating apparatuses and applications thereof, and thus, the characteristics of LEDs used therefor need to be improved.

SUMMARY

An aspect of the present inventive concept relates to a method of manufacturing a substrate for mounting an electronic device allowing for a reduction in manufacturing time and costs.

An aspect of the present inventive concept encompasses a method of manufacturing a substrate for mounting an electronic device, the method including steps of: forming at least one through-hole in a plate-shaped substrate body in a thickness direction thereof; forming an electrode substrate having at least one core on an upper surface thereof such that the at least one core corresponds to the at least one through-hole; coupling the electrode substrate to the substrate body by inserting the at least one core into the at least one through-hole; and removing a portion of the coupled electrode substrate except for the at least one core.

The electrode substrate may be formed by etching a silicon (Si) substrate. The substrate body may be a silicon (Si) substrate.

The step of forming the electrode substrate may be performed by injecting a synthetic resin into a mold having a shape corresponding to a shape of the electrode substrate, and may further include the step of forming a metal layer on a surface of the electrode substrate.

The step of forming the electrode substrate may include the step of processing an upper surface of a metal plate to form the at least one core.

The step of coupling the electrode substrate to the substrate body may be performed by inserting the at least one core into the at least one through-hole and conducting an underfill process using a resin. The resin may be an epoxy resin or a silicon resin.

The portion of the electrode substrate except for the at least one core may be removed by grinding.

The substrate body may have a resistance value greater than a resistance value of the electrode substrate.

The step of coupling the electrode substrate to the substrate body may be performed by inserting the at least one core into the at least one through-hole and conducting a Si direct bonding (SDB) process thereupon.

The method may further include the step of forming an under bump metallurgy (UBM) to cover an exposed surface of the at least one core coupled to the through-hole after removing the portion of the electrode substrate except for the at least one core.

The step of coupling the electrode substrate to the substrate body may be performed by fitting the at least one core into the at least one through-hole.

The step of coupling the electrode substrate to the substrate body may be performed by applying an adhesive to a contact surface between the substrate body and the electrode substrate.

BRIEF DESCRIPTION OF THE DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION OF THE EMBODIMENTS

Figure 1:
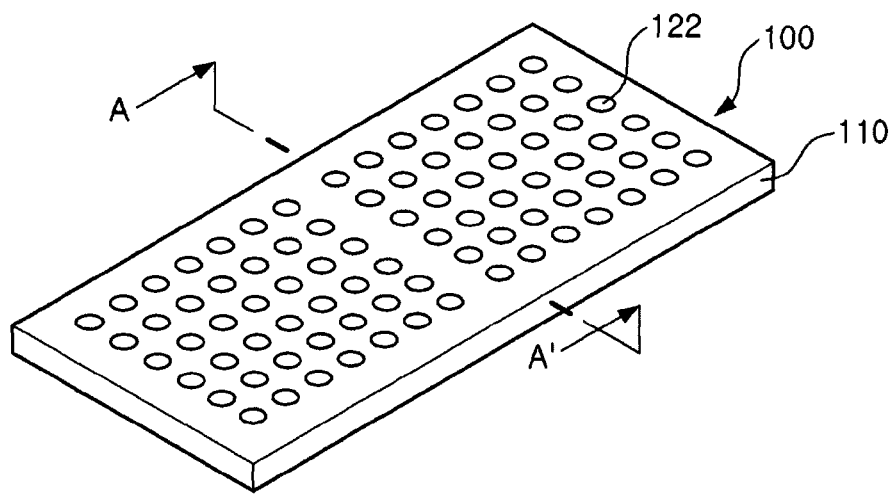
FIG. 1 is a schematic perspective view illustrating a substrate for mounting an electronic device according to an embodiment of the present inventive concept.

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

FIG. 1 is a schematic perspective view illustrating a substrate 100 for mounting an electronic device according to an embodiment of the present inventive concept. The substrate 100 may include a substrate body 110 and a metal layer 122.

FIGS. 2 through 5 are schematic cross-sectional views along the line A-A' in FIG. 1, illustrating a method of manufacturing a substrate for mounting an electronic device according to an embodiment of the present inventive concept.

Figure 2:
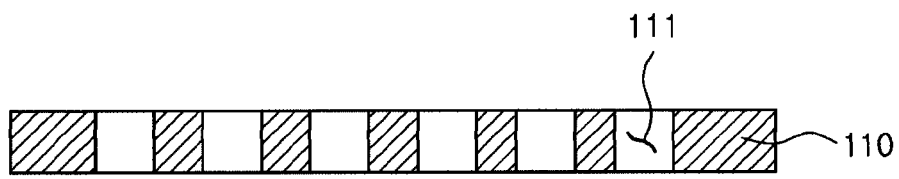
FIGS. 2 through 5 are schematic cross-sectional views along the line A-A' in FIG. 1, illustrating a method of manufacturing a substrate for mounting an electronic device according to an embodiment of the present inventive concept.

As shown in FIG. 2, a through-hole 111 is formed in the substrate body 110.

The substrate body 110 may have a plate shape, or a shape of a flat and thin piece. A semiconductor substrate formed of Si, sapphire, ZnO, GaAs, SiC, $MgAl_2O_4$, MgO, $LiAlO_2$, $LiGaO_2$, GaN or the like may be used therefor.

At least one through-hole 111 may be formed in the substrate body 110 in a thickness direction thereof. Alternatively, the substrate body 110 having the at least one through-hole 111 defined therein in a thickness direction of the substrate body 110 may be provided.

The through-hole 111 may be formed as a pillar reception space penetrating the substrate body 110 in the thickness direction thereof. The pillar reception space may be variously shaped, and may be, for example, cylindrical, poly-prismatic, or the like. In an embodiment of the present inventive concept, the through-hole 111 may be formed as a cylindrical space; however, the present inventive concept is not limited thereto.

The through-hole 111 may be formed by dry-etching the substrate body 110. The etching process is not limited to the dry-etching process, and other general etching processes may be used. Further, the through-hole 111 may be formed by a laser-drilling method.

Figure 3:
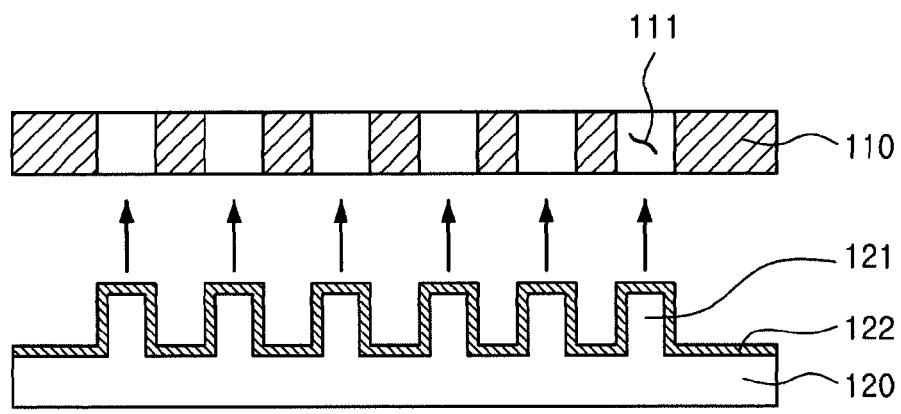

Next, as shown in FIG. 3, an electrode substrate 120 having at least one core 121 on an upper surface thereof may be formed, the at least one core 121 being coupled to the at least one through-hole 111. Alternatively, the electrode substrate 120 having the at least one core 121 disposed thereon may be provided.

The electrode substrate 120 may be a substrate having the at least one core 121 protruding therefrom. The number of the core 121 coupled to the through-hole 111 corresponds to the number of the through-hole 111. The electrode substrate 120 may be formed of various materials such as a metal or an insulating material such as a synthetic resin or the like. In particular, the electrode substrate 120 may be formed by injecting a synthetic resin into a mold having a shape corresponding to the shape of the electrode substrate 120. In addition, the electrode substrate 120 may be formed by an injection molding process, a milling process or a laser process undertaken on an upper surface of a metal plate.

At least one core 121 may be formed on the upper surface of the electrode substrate 120. The core 121 is coupled to the through-hole 111, thereby allowing an electric current to be applied to both surfaces of the substrate 100 for mounting an electronic device.

The size of the core 121 may correspond to the size of the through-hole 111 so as to be inserted thereto, in consideration of a margin of error in a manufacturing process thereof, a metal layer that may be additionally deposited thereon, or the like. Here, the core 121 may be formed on the electrode substrate 120 by a micro-electro-mechanical systems (MEMS) process or the like.

In a case in which the core 121 is formed of an insulating material such as a synthetic resin, a metal layer 122 is further formed on a surface of the core 121, thereby allowing an electric current to be applied to both surfaces of the substrate 100 for mounting an electronic device. The metal layer 122 is formed to enclose the surface of the core 121. The metal layer 122 may be provided as a single metal layer or as a plurality of metal layers formed of at least a metal material selected from the group consisting of Ni, Au, Ag, Ti, Cr and Cu. The core 121 may be formed by a sputtering method, a deposition method such as a chemical vapor deposition method, an electron beam evaporation method, or the like.

When a through via in a substrate for mounting an electronic device is formed by a plating process undertaken on a through-hole, a significant amount of time may be consumed in the manufacturing of such a substrate. In particular, when the through-hole is formed as an elongated micro-tube, it may take a considerable amount of time to plate the through-hole with a metal. Further, a void may be easily formed therein. Also, a plating process difficult in terms of maintenance management may not be implemented, whereby a simplified process and reduced manufacturing costs may be expected. In one embodiment of the present inventive concept, a previously prepared core-type electrode is provided to be fitted into the through-hole, instead of the above-mentioned plating process, and thus, the required manufacturing time may be shortened as compared to the above-mentioned method using a plating process and the formation of a void may be prevented.

Figure 4:
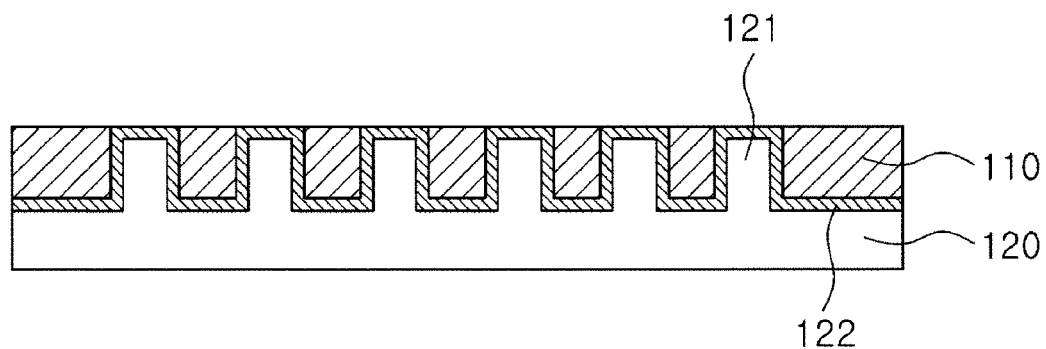
Figure 5:
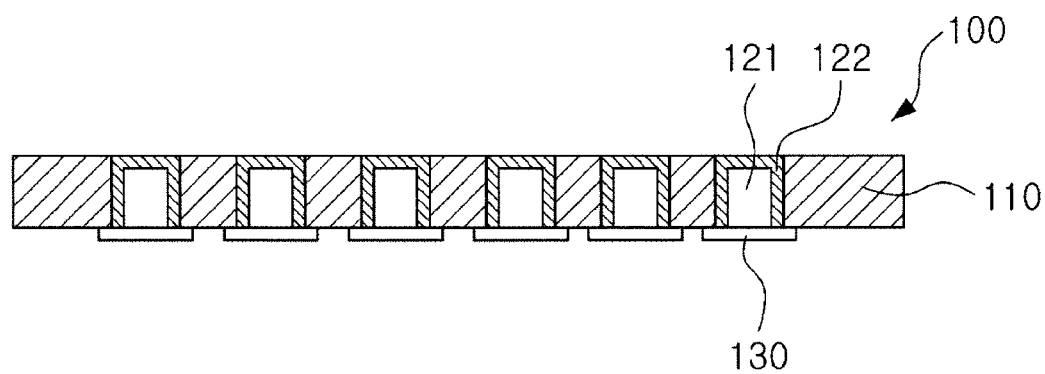

Next, as shown in FIG. 4, the core 121 is inserted into the through-hole 111, such that the Substrate body 110 and the electrode substrate 120 are coupled to each other.

The coupling of the substrate body 110 and the electrode substrate 120 may be performed by fitting the core 121 into the through-hole 111. Alternatively, after the substrate body 110 and the electrode substrate 120 are coupled to each other, a contact surface between the substrate body 110 and the electrode substrate 120 may be subjected to an underfill process using a resin. Here, an epoxy resin or a silicon resin may be used therefor.

Alternatively, the substrate body 110 and the electrode substrate 120 may be coupled by applying an adhesive (not separately shown) to the contact surface between the substrate body 110 and the electrode substrate 120. In this manner, when the substrate body 110 and the electrode substrate 120 are coupled to each other, an end portion of the core 121 or the metal layer 122 formed on the end portion of the core 121 may be exposed as shown in FIG. 4.

Then, a portion of the electrode substrate 120, except for the core 121, may be removed. The partial removal of the electrode substrate 120 may be performed by a physical method such as a grinding process undertaken on the insulating electrode substrate 120; however, a removal method is not limited thereto. When the portion of the electrode substrate 120 except for the core 121 is removed, the core 121 may be exposed while penetrating both surfaces of the substrate body 110.

As stated above, in the case in which the core 121 is formed of a metal, the electric conductivity of the core 121 itself may allow an electric current to be applied to both surfaces of the substrate body 110. In a case in which the core 121 is formed of an insulating material such as a synthetic resin, the metal layer 122 formed on the surface of the core 121 may allow an electric current to be applied to both surfaces of the substrate body 110.

After the removal of the portion of the electrode substrate 120 with the exception of the core 121, an under bump metallurgy (UBM) 130 may be further formed to cover the exposed surface of the core coupled to the through-hole 111. The UBM 130 may serve as a contact point for soldering of the substrate body 110, and may be formed of Ti, Ni, Cu, a Cu alloy, or the like.

Figure 7:
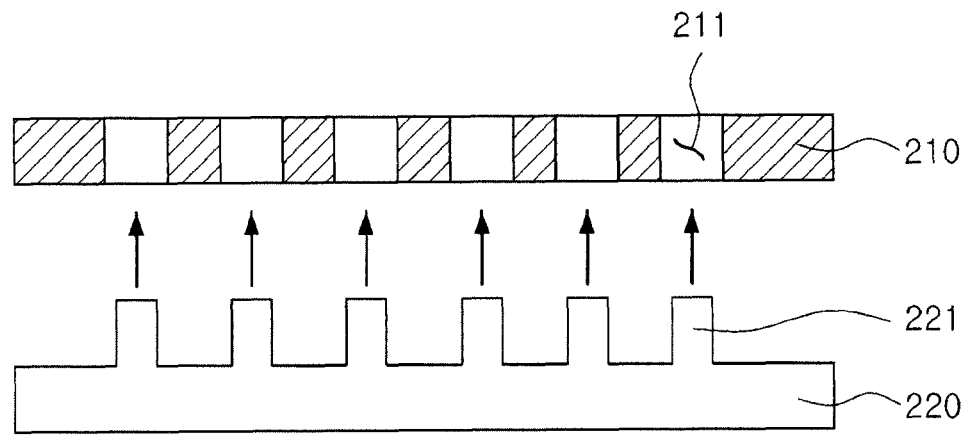
Figure 8:
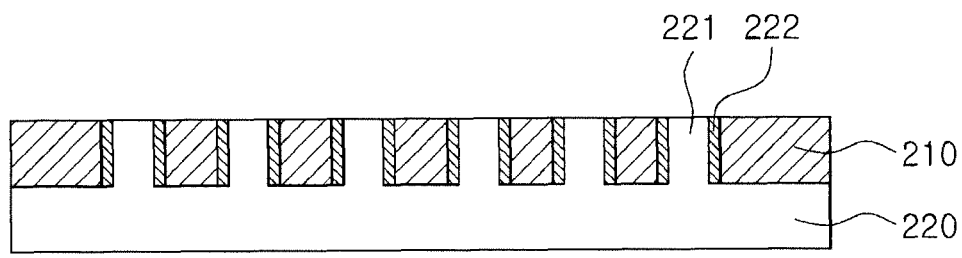
Figure 9:
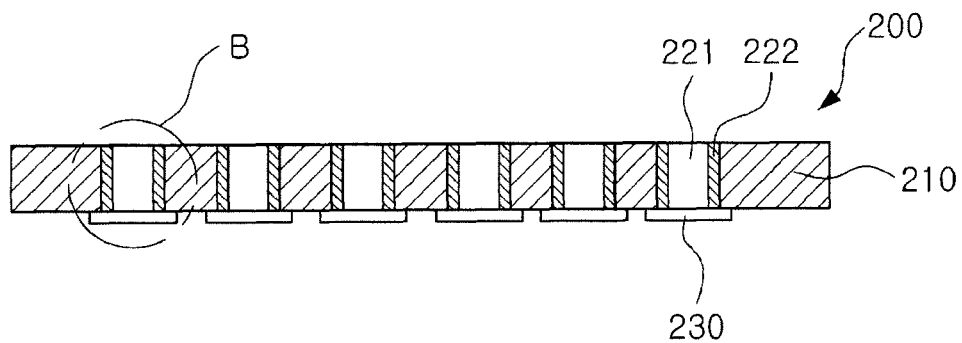
Figure 10:
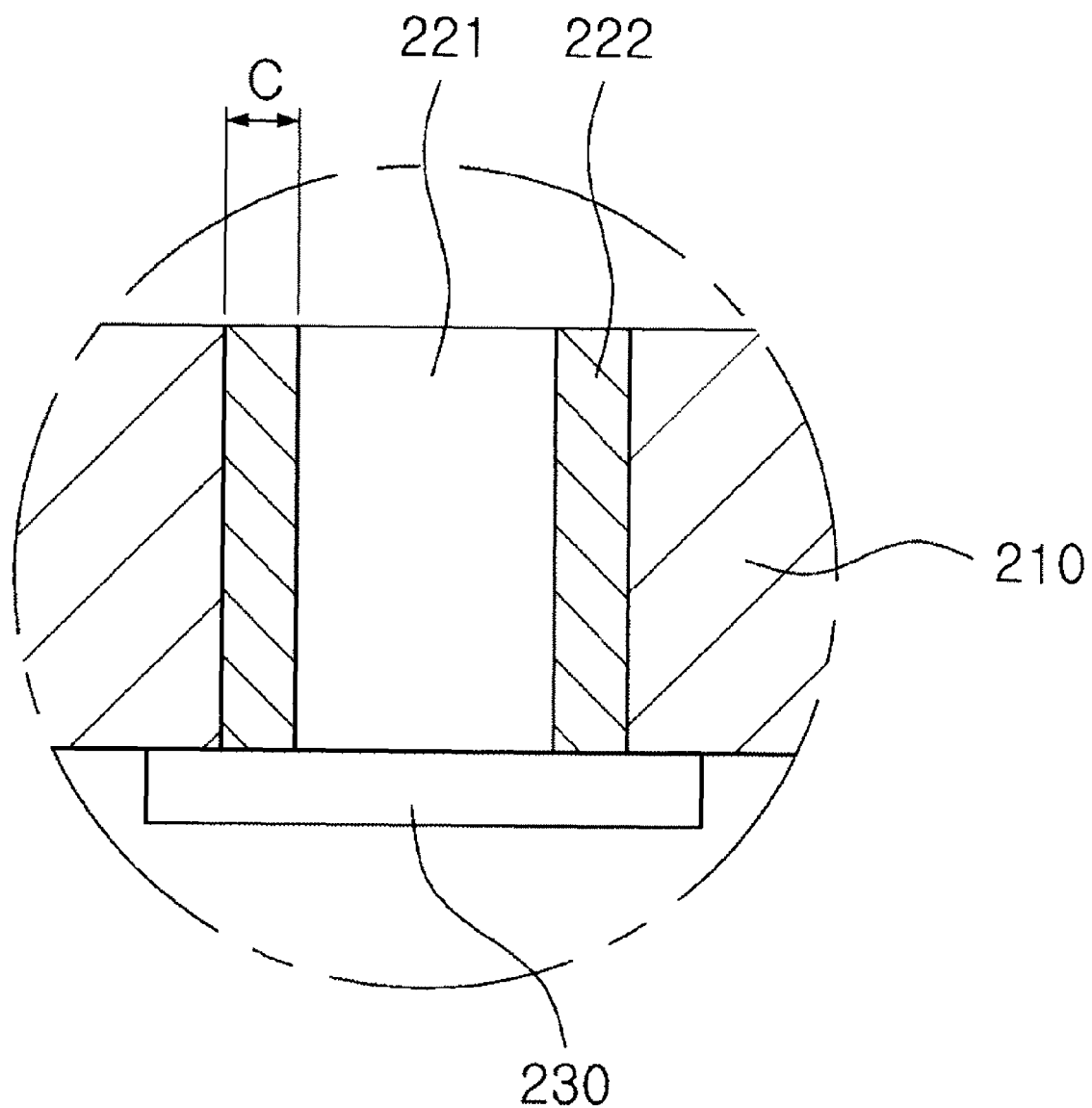
FIG. 10 is an enlarged view of portion B of FIG. 9

FIGS. 6 through 9 are schematic cross-sectional views illustrating a method of manufacturing a substrate for mounting an electronic device according to another embodiment of the present inventive concept, and FIG. 10 is an enlarged view of portion B of FIG. 9.

A substrate body 210 and an electrode substrate 220 in this embodiment are formed of Si, and a core 221 of the electrode substrate 220 is coupled to the substrate body 210 by Si direct bonding (SDB).

Figure 6:
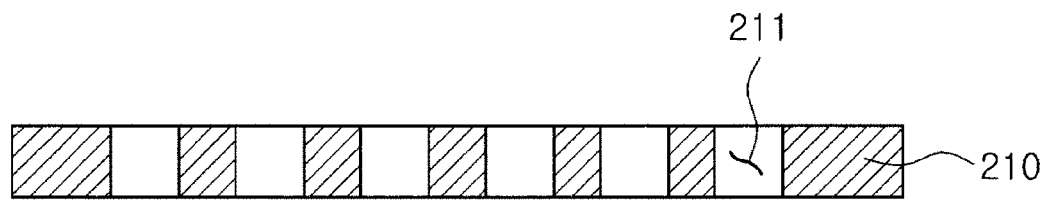
FIGS. 6 through 9 are schematic cross-sectional views illustrating a method of manufacturing a substrate for mounting an electronic device according to another embodiment of the present inventive concept.

As shown in FIG. 6, a through-hole 211 may be formed in the substrate body 210. The substrate body 210 may be a plate-shaped semiconductor substrate. Specifically, a silicon substrate may be used therefor. At least one through-hole 211 may be formed in a thickness direction of the substrate body 210.

At least one through-hole 211 may be formed in the thickness direction of the substrate body 210. The through-hole 211 may be formed as a pillar reception space penetrating the substrate body 210 in the thickness direction thereof. The pillar reception space may be variously shaped, and may be, for example, cylindrical, poly-prismatic, or the like. In an embodiment of the present inventive concept, the through-hole 211 may be formed as a cylindrical space. The through-hole 211 may be formed by dry etching or laser drilling.

Next, as shown in FIG. 7, the electrode substrate 220 having at least one core 221 formed on an upper surface thereof may be formed, and the at least one core 221 is coupled to the at least one through-hole 211. The electrode substrate 220 may be a substrate having the at least one core 221 protruding therefrom. The number of the core 221 coupled to the through-hole 211 corresponds to that of the through-hole 211. As described in the foregoing embodiment, the core 221 is coupled to the through-hole 211, thereby allowing an electric current to be applied to both surfaces of the substrate body 210. A semiconductor substrate having a plate shape may be used for the electrode substrate 220. In particular, a silicon substrate may be used therefor.

The size of the core 221 may correspond to the size of the through-hole 211 so as to be inserted thereinto, in consideration of a margin of error in the manufacturing process thereof, a metal layer that may be additionally deposited thereon, or the like. Here, the core 221 may be formed by a micro-electro-mechanical systems (MEMS) process or the like.

Then, as shown in FIG. 8, the core 221 may be inserted into the through-hole 211 such that the electrode substrate 220 may be coupled to the substrate body 210. The coupling of the electrode substrate 220 and the substrate body 210 may be performed by the Si direct bonding (SDB) of the through-hole 211 of the substrate body 210 and the core 221 of the electrode substrate 220.

Specifically, SDB is a method allowing for the bonding of two semiconductor substrates through a heat treatment, without an adhesive. Since an adhesive layer is not formed, a module or a process for forming and removing the adhesive layer is not required, thereby reducing manufacturing costs and time.

For example, the coupling of the substrate body 210 and the core 221 of the electrode substrate 220 may be performed by growing a bonding layer 222 between the substrate body 210 and the electrode substrate 220 through the heat treatment. In an embodiment of the present inventive concept, the bonding layer 222 may be formed as a $SiO_2$ layer. The $SiO_2$ layer may be grown to thereby allow the substrate body 210 and the core 221 of the electrode substrate 220 to be coupled to each other.

Here, as shown in FIG. 10, a gap C between the substrate body 210 and the core 221 may be within a range of growth of the $SiO_2$ layer able to be formed by the heat treatment. Specifically, the range of the gap C may be 10 μm or less.

In the case in which the substrate body 210 and the core 221 of the electrode substrate 220 are coupled by the SDB method, the $SiO_2$ layer is only grown between the substrate body 210 and the core 221 of the electrode substrate 220, while the $SiO_2$ insulating layer is not grown on an upper surface of the core 221 of the electrode substrate 220 exposed through the through-hole 211. Also, in a case in which a resistance value of the substrate body 210 is greater than a resistance value of the electrode substrate 220, the core 221 may function as an electrode. The resistance values of the substrate body 210 and the electrode substrate 220 may be controlled by adjusting the concentration of impurities doped thereon. The resistance values of the substrate body 210 and the electrode substrate 220 are not particularly limited. The resistance values may be within a range in which a value of current flowing in the substrate body 220 is insignificant relative to a value of current flowing in the core 221 such that the core 221 may only serve as a conductor.

Then, as shown in FIG. 9, a portion of the electrode substrate 220, except for the core 221, may be removed. The partial removal of the electrode substrate 220 may be performed by a physical method such as a grinding process undertaken on the insulating electrode substrate 220; however, a removal method is not limited thereto. When the portion of the electrode substrate 220 except for the core 221 may be removed, the core 221 may be exposed while penetrating both surfaces of the substrate body 210.

After the removal of the portion of the electrode substrate 220 with the exception of the core, an under bump metallurgy (UBM) 230 may be further formed to cover the exposed surface of the core 221 coupled to the through-hole 211. The UBM 130 may serve as a contact point for soldering of the substrate body 210, and may be formed of Ti, Ni, Cu, a Cu alloy, or the like.

As set forth above, according to embodiments of the inventive concept, a method of manufacturing a substrate for mounting an electronic device allows for a reduction in manufacturing time, such that an LED manufacturing yield rate may be improved and manufacturing costs thereof may be reduced.

Although a few exemplary embodiments of the present inventive concept have been shown and described, the present inventive concept is not limited to the described exemplary embodiments. Instead, it would be appreciated by those skilled in the art that changes may be made to these exemplary embodiments without departing from the principles and spirit of the inventive concept, the scope of which is defined by the appended claims and their equivalents.

What is claimed is:

1. A method of manufacturing a substrate for mounting an electronic device, the method comprising steps of:
    forming at least one through-hole in a plate-shaped substrate body in a thickness direction thereof;
    forming an electrode substrate having at least one core on an upper surface thereof, such that the at least one core corresponds to the at least one through-hole,
    wherein the at least one core is formed of an insulating material;
    coupling the electrode substrate to the substrate body by inserting the at east one core into the at least one through-hole; and
    removing a portion of the coupled electrode substrate except for the at least one core.

2. The method of claim 1, wherein the step of coupling the electrode substrate to the substrate body is performed by inserting the at least one core into the at least one through-hole and conducting an underfill process using a resin.

3. The method of claim 2, wherein the resin is an epoxy resin or a silicon resin.

4. The method of claim 1, wherein the portion of the electrode substrate except for the at least one core is removed by grinding.

5. The method of claim 1, further comprising the step of:
forming an under bump metallurgy (UBM) to cover an exposed surface of the at least one core coupled to the through-hole after removing the portion of the electrode substrate except for the at least one core.

6. The method of claim 1, wherein the step of coupling the electrode substrate to the substrate body is performed by fitting the at least one core into the at least one through-hole.

7. The method of claim 1, wherein the step of coupling the electrode substrate to the substrate body is performed by applying an adhesive to a contact surface between the substrate body and the electrode substrate.

8. The method of claim 1, further comprising a step of:
forming a metal layer on a surface of the at least one core formed of the insulating material on the electrode substrate, prior to the coupling of the electrode substrate to the substrate body,
wherein the metal layer forms a conductive path through the substrate body following the inserting of the at least one core into the at least one through-hole of the substrate body.

9. A method of manufacturing a substrate for mounting an electronic device, the method comprising steps of:
forming at least one through-hole in a plate-shaped substrate body in a thickness direction thereof;
forming an electrode substrate having at least one core on an upper surface thereof, such that the at least one core corresponds to the at least one through-hole;
coupling the electrode substrate to the substrate body by inserting the at least one core into the at least one through-hole; and
removing a portion of the coupled electrode substrate except for the at least one core,
wherein the electrode substrate is formed by etching a silicon (Si) substrate.

10. The method of claim 9, wherein the substrate body is a silicon (Si) substrate.

11. The method of claim 10, wherein the substrate body has a resistance value greater than a resistance value of the electrode substrate.

12. The method of claim 11, wherein the step of coupling the electrode substrate to the substrate body is performed by inserting the at least one core into the at least one through-hole and conducting a Si direct bonding (SDB) process thereupon.

13. A method of manufacturing a substrate for mounting an electronic device, the method comprising steps of:
forming at least one through-hole in a plate-shaped substrate body in a thickness direction thereof;
forming an electrode substrate having at least one core on an upper surface thereof, such that the at least one core corresponds to the at least one through-hole;
coupling the electrode substrate to the substrate body by inserting the at least one core into the at least one through-hole; and
removing a portion of the coupled electrode substrate except for the at least one core,
wherein the step of forming the electrode substrate is performed by injecting a synthetic resin into a mold having a shape corresponding to a shape of the electrode substrate.

14. The method of claim 13, wherein the step of forming the electrode substrate further includes forming a metal layer on a surface of the electrode substrate.

15. The method of claim 13, wherein the step of forming the electrode substrate includes processing an upper surface of a metal plate to form the at least one core.

16. A method of manufacturing a substrate for mounting an electronic device, the method comprising steps of:
coupling an electrode substrate having at least one core formed of an insulating material on an upper surface thereof, to a plate-shaped substrate body having at least one through-hole defined in a thickness direction of the substrate body, by inserting the at least one core into the at least one through-hole; and
removing a portion of the coupled electrode substrate except for the at east one core.

17. The method of claim 16, further comprising a step of:
forming a metal layer on a surface of the at least one core formed of the insulating material, prior to the coupling of the electrode substrate to the substrate body,
wherein the metal layer forms a conductive, path through the substrate body following the inserting of the at least one core into the at least one through-hole of the substrate body.

* * * * *